(12) United States Patent
Xie et al.

(10) Patent No.: US 11,094,894 B2
(45) Date of Patent: Aug. 17, 2021

(54) METHOD FOR MANUFACTURING A DISPLAY MOTHERBOARD

(71) Applicant: BOE TECHNOLOGY GROUP CO., LTD., Beijing (CN)

(72) Inventors: Chunyan Xie, Beijing (CN); Paoming Tsai, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/212,754

(22) Filed: Dec. 7, 2018

(65) Prior Publication Data
US 2019/0326529 A1    Oct. 24, 2019

(30) Foreign Application Priority Data

Apr. 24, 2018   (CN) .......................... 201810373959.8

(51) Int. Cl.
*H01L 51/00*   (2006.01)
*G09F 9/30*   (2006.01)
(Continued)

(52) U.S. Cl.
CPC ........ *H01L 51/0097* (2013.01); *B29C 53/005* (2013.01); *B29C 53/063* (2013.01);
(Continued)

(58) Field of Classification Search
CPC .............................. H01L 51/0097; B32B 7/12
See application file for complete search history.

(56) References Cited

U.S. PATENT DOCUMENTS

2004/0150331 A1*  8/2004  Okubo ................ H01L 51/0097
                                                        313/506
2006/0194363 A1*  8/2006  Giesberg ............. H01L 51/0545
                                                        438/99
(Continued)

FOREIGN PATENT DOCUMENTS

CN        104271694 A      1/2015
CN        205356800 U      6/2016
CN        107819072 A      3/2018

OTHER PUBLICATIONS

First Office Action dated Jan. 2, 2020, for corresponding Chinese application 201810373959.8.
(Continued)

*Primary Examiner* — Benjamin A Schiffman
(74) *Attorney, Agent, or Firm* — Nath, Goldberg & Meyer; Joshua B. Goldberg

(57) ABSTRACT

The present disclosure provides a display motherboard and a method for manufacturing the same, a display substrate and a method for manufacturing the same, and a display device, and belongs to the field of display technology. In the method for manufacturing the display motherboard of the present disclosure, the display motherboard includes a plurality of display substrate areas each including a sub display area and a sub bending area; and the method for manufacturing the display motherboard includes: forming an adhesive force variable back film material having a first adhesive force on a flexible underlying substrate; removing the back film material in positions above the sub bending areas; and treating the remaining back film material to form a back film having a second adhesive force, wherein the second adhesive force is greater than the first adhesive force.

12 Claims, 4 Drawing Sheets

(51) Int. Cl.
    *B29C 53/06*     (2006.01)
    *H01L 51/56*     (2006.01)
    *H01L 27/32*     (2006.01)
    *G09F 9/33*     (2006.01)
    *H01L 21/78*     (2006.01)
    *B29C 53/00*     (2006.01)
    *H01L 21/67*     (2006.01)
    *B29L 31/34*     (2006.01)
    *B29C 53/80*     (2006.01)

(52) U.S. Cl.
    CPC ............ *B29C 53/066* (2013.01); *G09F 9/301* (2013.01); *G09F 9/33* (2013.01); *H01L 21/78* (2013.01); *H01L 27/3244* (2013.01); *H01L 51/56* (2013.01); *B29C 53/8083* (2013.01); *B29C 2793/0054* (2013.01); *B29L 2031/3475* (2013.01); *H01L 21/67115* (2013.01); *H01L 21/67132* (2013.01); *H01L 27/3272* (2013.01); *H01L 2227/323* (2013.01); *H01L 2251/5338* (2013.01); *H01L 2251/558* (2013.01); *H01L 2251/566* (2013.01)

(56) References Cited

U.S. PATENT DOCUMENTS

2010/0243140 A1    9/2010   Sloan
2017/0125726 A1*  5/2017   Hwang ............. G02F 1/133308
2018/0076400 A1    3/2018   Jung et al.

OTHER PUBLICATIONS

Second Office Action dated Aug. 18, 2020, for corresponding Chinese application 201810373959.8.

* cited by examiner

METHOD FOR MANUFACTURING A DISPLAY MOTHERBOARD

CROSS REFERENCE TO RELATED APPLICATION

This application claims the benefit of Chinese Patent Application No. 201810373959.8, filed on Apr. 24, 2018, entitled "DISPLAY MOTHERBOARD AND METHOD FOR MANUFACTURING THE SAME, DISPLAY SUBSTRATE AND METHOD FOR MANUFACTURING THE SAME, AND DISPLAY DEVICE", which is hereby incorporated by reference in its entirety into this application.

TECHNICAL FIELD

The present disclosure relates to the field of display technology, and in particular, to a display motherboard and a method for manufacturing the same, a display substrate and a method for manufacturing the same, and a display device.

BACKGROUND

An organic OLED flexible display substrate is generally composed of a flexible underlying substrate, a TFT array located, an OLED light emitting device and a thin film package structure. A narrow frame of an existing bottom frame is implemented by bending a bonding area to the back face. In order to achieve small-radius bending in a folded-back type, a portion of a back film corresponding to a bending area needs to be removed. As the back film used in the prior art has a large adhesive force, if it is directly applied to a display motherboard, the portion of the back film corresponding to the bending area cannot be stripped off. Therefore, in the prior art, the motherboard is firstly cut into many display substrates, and then small pieces of back film are attached to the display substrates one by one.

The attachment process of the back film in the prior art is complicated, the efficiency is low, the equipment demand is high, and the cost is large. Therefore, a back film attachment method capable of improving the process efficiency is needed.

SUMMARY

The objective of the present disclosure is to at least partially solve the above technical problems in the prior art, and to provide a display motherboard and a method for manufacturing the same, a display substrate and a method for manufacturing the same, and a display device.

In one aspect, the present disclosure provides a method for manufacturing a display motherboard including the following steps, wherein the display motherboard includes a plurality of display substrate areas comprising a sub display area, a bonding area and a sub bending area:

forming a back film material on a flexible underlying substrate, wherein the back film material has a first adhesive force;

removing the back film material in positions above the sub bending areas; and treating the remaining back film material to form a back film having a second adhesive force, wherein the second adhesive force is greater than the first adhesive force.

Optionally, between the step of treating the remaining back film material to form a back film having the second adhesive force, and the step of removing the back film material in positions above the sub bending areas, the method for manufacturing a display motherboard further includes:

forming a protective film on one side of the back film material away from the flexible underlying substrate.

Optionally, the plurality of display substrate areas in the display motherboard are arranged in an array, the display motherboard includes a bending area, and the bending area runs through the sub bending areas located on the same column; and the step of removing the back film material in positions above the sub bending areas includes:

removing the back film material in position above the bending area of the display motherboard so as to remove the back film material in positions above the sub bending areas.

Optionally, the step of treating the remaining back film material to form a back film having the second adhesive force includes:

irradiating the remaining back film material with UV light to form the back film having the second adhesive force.

Optionally, UV illumination is performed on one side of the flexible underlying substrate having the back film material.

Optionally, the energy of the UV illumination is about 1000-5000 mJ/cm$^2$, and the illumination time is about 30-120 s.

Optionally, the step of treating the remaining back film material to form a back film having the second adhesive force specifically includes:

heating the remaining back film material to form the back film having the second adhesive force.

Optionally, the heating is performed on one side of the flexible underlying substrate having the back film material.

Optionally, the heating temperature is about 60-80° C., and the heating time is about 2-20 min.

Optionally, the first adhesive force is about 20-400 g/inch.

Optionally, the second adhesive force is greater than 1 kg/inch.

Optionally, the back film material includes an adhesive force variable adhesive material.

The adhesive force variable adhesive material includes an adhesive and an initiator.

The adhesive material includes any one or more of acrylic resin, epoxy resin and polyurethane resin, and the initiator includes any one of azobisisobutyronitrile, benzophenone, fluorescein, and eosin.

Optionally, the sub bending area is located between the sub display area and the binding area.

The present disclosure further provides a method for manufacturing a display substrate, including; manufacturing a display motherboard according to the above preparation method.

The present disclosure further provides a display motherboard, including; a plurality of display substrate areas each including a sub display area, a bonding area and a sub bending area; and a back film having openings corresponding to the sub bending areas, wherein the back film has a second adhesive force obtained by treating a back film material having a first adhesive force and the second adhesive force is greater than the first adhesive force.

The present disclosure further provides a display substrate, including a sub display area, a bonding area and a sub bending area, wherein the display substrate further includes a back film having openings corresponding to the sub bending area, wherein the back film has a second adhesive force obtained by treating a back film material having a first adhesive force and the second adhesive force is greater than the first adhesive force.

The present disclosure further provides a display device, including the above display substrate.

DETAILED DESCRIPTION OF CERTAIN EMBODIMENTS

Figure 1:
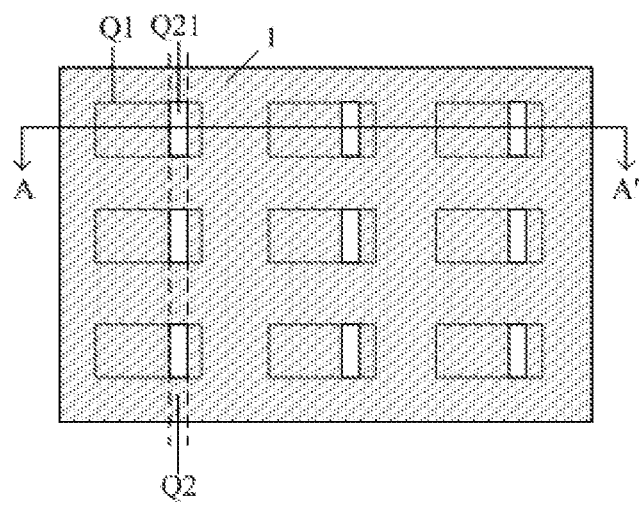
FIG. 1 is a top view of a display motherboard according to an embodiment of the present disclosure.
Figure 2:
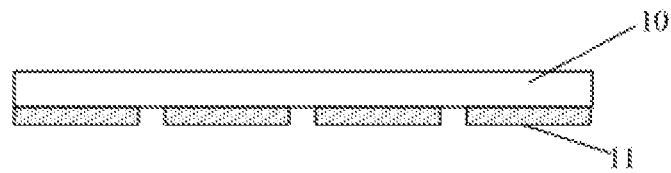
FIG. 2 is a section view of A-A' of FIG. 1.
Figure 3:
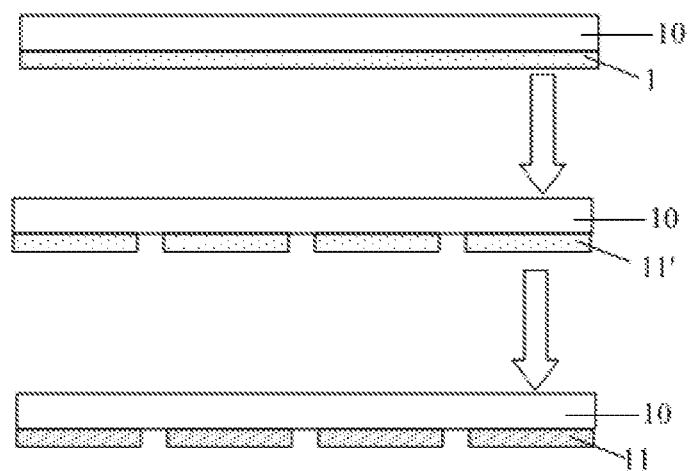
FIG. 3 is a schematic diagram of steps of a method for manufacturing a display motherboard according to an embodiment of the present disclosure.
Figure 4:
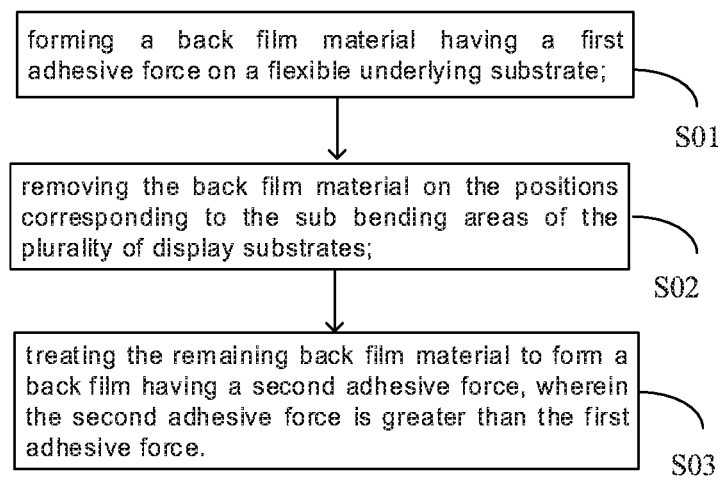
FIG. 4 is a flowchart of a method for manufacturing a display motherboard according to an embodiment of the present disclosure.

The present disclosure is further described in detail below in conjunction with the drawings and specific embodiments, so that those skilled in the art may better understand the technical solutions of the present disclosure.

As shown in FIGS. 1 to 4, some embodiments of the present disclosure provide a method for manufacturing a display motherboard including the following steps, wherein the display motherboard includes a plurality of display substrate areas Q1 (areas corresponding to a display substrate) each including a sub display area, a bonding area and a sub bending area Q21.

S01, a back film material 1 having a first adhesive force is formed on a flexible underlying substrate 10.

In the step S01, the flexible underlying substrate 10 may be formed by coating a flexible underlying material on a glass substrate carrier and curing the same into a film. The obtained flexible underlying film has a thickness in the range of about 5 to 30 μm. The flexible underlying material may be selected from polyimide (PI), polyethylene naphthalate (PEN), polyethylene terephthalate (PET), and the like.

The back film material 1 may includes a substrate and an adhesive material located on the substrate, and the adhesive material includes an adhesive force variable adhesive material. The substrate is generally a material such as PET, PEN or PI. The thickness of the substrate is generally about 10-200 μm. The adhesive force variable adhesive material includes an adhesive and an initiator. Based on the total weight of the adhesive force variable adhesive material, the content of the initiator is about 1% by weight to about 5% by weight.

The first adhesive force may be about 10-400 g/inch.

Under an action of light or heat, the initiator initiates a cross linking reaction of the adhesive, so that the adhesive force of the adhesive material may be greatly improved. The adhesive may be any adhesive that may increase its adhesive force by an action of light and heat, such as any one or more of acrylic resin, epoxy resin and polyurethane resin. The initiator may be any agent that may initiate the cross linking reaction of the adhesive so as to improve the adhesive force therefore, such as any one or more of azobisisobutyronitrile, benzophenone, fluorescein and eosin. Of course, the adhesive and the initiator are not limited to the above several types, and those skilled in the art may also select other suitable adhesives and initiators according to the practical applications.

S02, the back film material in positions above the sub bending areas Q21 is removed.

It should be understood that the display motherboard generally includes a plurality of display substrate areas Q1 and each display substrate area Q1 is used for forming a display substrate. Each display substrate area Q1 includes a sub display area, a bonding area and a sub bending area, wherein the sub bending area Q21 is located between the binding area and the sub display area in the display substrate area Q1. A flexible printed circuit board in the display substrate could be bent to a non-display surface of the display substrate by bending the sub bending area.

S03, the remaining back film material 11' is treated to form a back film 11 having a second adhesive force, wherein the second adhesive force is greater than the first adhesive force.

In this step, the remaining back film material 11' may be treated by UV illumination or heating to form the back film 11 having the second adhesive force and the obtained back film is firmly adhered to the flexible underlying substrate 10. The second adhesion may range from about 1 kg/inch to about 2.5 kg/inch.

The energy of the UV illumination is about 1000-5000 $mJ/cm^2$ (for example, 2000 $mJ/cm^2$, 3000 $mJ/cm^2$, 4000 $mJ/cm^2$ or 4500 $mJ/cm^2$ or the like), and the illumination time is about 30 s-120 s (for example, 40 s, 50 s, 60 s, 80 s or 100 s or the like).

The heating temperature is about 60-80° C. (for example, 65° C., 70° C. or 75° C.), and the heating time is about 2-20 min (for example, 5 min, 8 min, 10 min, 12 min, 15 min or 18 min).

Those skilled in the art may select suitable UV illumination or heating conditions to increase the adhesive force of the back film based on the specific adhesive force variable adhesive material.

Since the back film material 1 is an adhesive force variable adhesive material, when it has a smaller first adhesive force, it is easy to remove the back film material in positions above the sub bending areas Q21 in the display substrate areas Q1 in step S02. Therefore, in the method for manufacturing the display motherboard of the present embodiment, an entire back film material 1 may be directly formed on the flexible underlying substrate 10 of the display motherboard, and then the back film material 1 in position above each sub bending area Q21 can be removed by adopting a single process, which effectively simplifies the preparation process of the display motherboard and improves the preparation efficiency of the display motherboard.

In addition, in the method for manufacturing the display motherboard according to the present disclosure, the adhesive force of the back film material 1 is increased by illumination or heating, such that the back film material is converted into the back film 11 having the second adhesive force which could firmly combined with the flexible underlying substrate 10.

Figure 5:
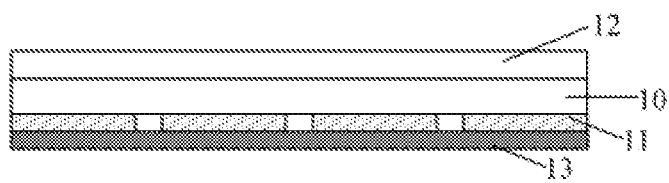
FIG. 5 is a structural schematic diagram of a display motherboard according to another embodiment of the present disclosure.
Figure 6:
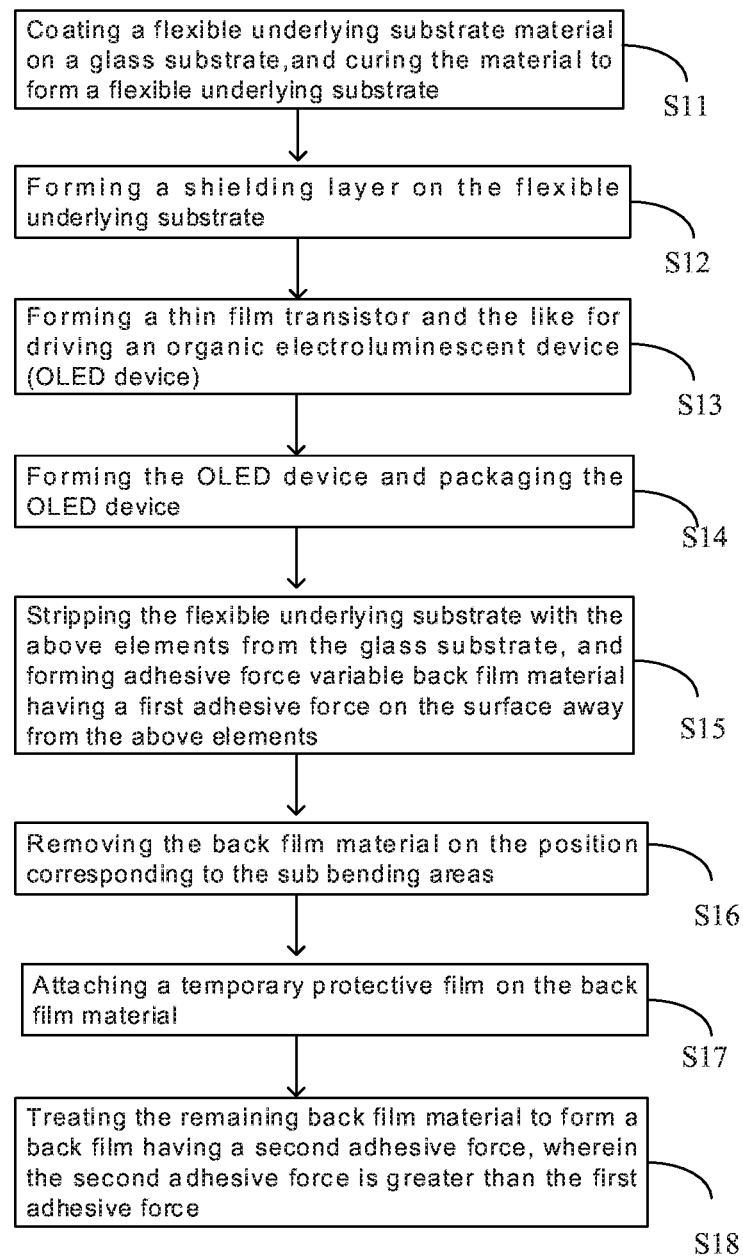
FIG. 6 is a flowchart of a method for manufacturing a display motherboard according to another embodiment of the present disclosure.

As shown in FIGS. 5 to 6, another embodiment of the present disclosure provides a method for manufacturing a display motherboard, including the following steps:

S11, a flexible underlying substrate material is coated on a glass substrate and is cured into a film to form a flexible underlying substrate 10. The flexible underlying substrate 10 has a thickness of about 5-30 μm, and the material may be selected from polyimide (PI), polyethylene naphthalate (PEN), and polyethylene terephthalate (PET), etc.

S12, a shielding layer is formed on the formed flexible underlying substrate 10. The shielding layer may have a one-layer or multilayer structure formed by a silicon oxide (SIO) or silicon nitride (SIN) material for providing water and oxidation resistance of the flexible underlying substrate 10.

Of course, a buffer layer may also be formed on a side of the resulting shielding layer away from the flexible underlying substrate 10, which is used to prevent elements formed subsequently from damaging the flexible underlying substrate 10. The buffer layer may also have a one-layer or multilayer structure formed by the silicon oxide (SIO) or silicon nitride (SIN) material.

S13, a thin film transistor for driving an organic electroluminescent device (OLED device 12) to emit light is formed on the flexible underlying substrate 10 on which the shielding layer and the buffer layer have been formed.

S14, each layer structure of the OLED device and a package layer for packaging the OLED device are formed on the flexible underlying substrate 10 on which the driving elements such as the thin film transistor is formed. The package layer includes a stacked structure of inorganic/organic layers, such as a three-layer package structure of first inorganic layer/first organic layer/second inorganic layer.

S15, the flexible underlying substrate 10 on which the above devices is formed is stripped off from the glass substrate carrier, and the adhesive force variable back film material 1 having a first adhesive force is formed on the side of the flexible underlying substrate 10 away from the formed devices.

The first adhesive force is about 10-400 g/inch.

The back film material 1 includes a substrate and an adhesive material including an adhesive force variable adhesive material on the substrate. The substrate is generally made of a material such as PET, PEN or PI. The substrate generally has a thickness of about 10-200 μm. The adhesive force variable adhesive material includes an adhesive and an initiator. Based on the total weight of the adhesive force variable adhesive material, the content of the initiator is about 1% by weight to about 5% by weight.

The adhesive may include any one or more of acrylic resin, epoxy resin and polyurethane resin. The initiator may include any one of azobisisobutyronitrile, benzophenone, fluorescein and eosin.

S16, the back film material in positions above the sub bending areas Q21 is removed.

Generally, the display motherboard includes a plurality of display substrate areas Q1 arranged in an array, and the bending area Q2 of the display motherboard runs through the sub bending areas Q21 located in the same column. In this case, the back film material 1 corresponding to the positions of the sub bending areas Q21 may be removed by removing the back film material in position above the bending area Q2 of the display motherboard in a single step. Therefore, a column of sub bending areas Q21 may be removed at one time, thus further improving the working efficiency.

When the back film material in position above the bending area Q2 is removed, one end of the back film material to be removed may be adhered by using an adhesive tape or roller, and then the back film material is removed by pulling the adhesive tape or roller. Multiple rows or columns of back film materials to be removed may be adhered by the adhesive tape, and then the back film materials are removed at one time.

S17, a temporary protective film 13 is adhered on one side of the back film material away from the flexible underlying substrate.

After the display motherboard is cut into a single display substrate, the back film 11 will be hollowed out at positions corresponding to the sub bending areas Q21. Under such conditions, if the protective film 13 is not provided, the flexible underlying substrate 10 may be scratched in the subsequent process, or the display substrate may be deformed and line breakage is caused. Therefore, the temporary protective film 13 functions as a support and performs a protection effect. It should be noted that the temporary protective film 13 needs to be stripped off when other film layers are formed later. The temporary protective film 13 may be any protective films conventionally used in the art, such as PET and the like.

S18, the remaining back film material 11' is treated to form a back film 11 having a second adhesive force, wherein the second adhesive force is greater than the first adhesive force.

The remaining back film material 11' may be treated by UV illumination or heating.

UV illumination treatment: the back film material is irradiated with UV light to form the back film 11 having the second adhesive force. The energy of the UV illumination is about 1000-5000 mJ/cm$^2$, and the illumination time is about 30 s-120 s. The second adhesive force of the obtained back film is about 1 kg/inch to 2.5 kg/inch, Heating treatment: the back film material 11' is heated to form the back film 11 having the second adhesive force. The heating temperature is about 60-80° C. and the heating time is about 2-20 min. The preparation of the display motherboard is completed so far.

Figure 7:
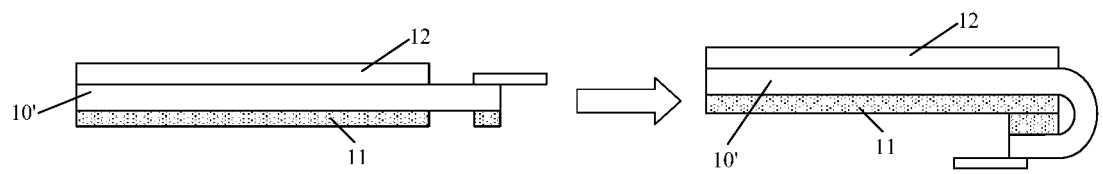
FIG. 7 is a schematic diagram of a bending process of a display substrate according to another embodiment of the present disclosure.

As shown in FIG. 7, on the basis of the method for manufacturing the display motherboard, some embodiments of the present disclosure provide a method for manufacturing a display substrate. The method for manufacturing the display substrate may include, in addition to the method for manufacturing the display motherboard, a step of cutting the formed display motherboard along a cutting line, and a step of bending along the sub bending area Q21. For example, the bonding area of the display substrate obtained after cutting is bent to one side of the display substrate away from the light outgoing side.

In the method for manufacturing the display substrate of the present disclosure, the back film on each display substrate is formed by a single process, and the display substrate and the back film would not be prepared separately and then adhered together, thereby greatly improving the preparation efficiency of the display substrate.

Of course, the method for manufacturing the display substrate in the present embodiment may further include a step of attaching other functional film layers.

Other embodiments of the present disclosure further provide a display motherboard, a display substrate, and a display device. The display motherboard may be obtained by the above method for manufacturing the display motherboard. The display motherboard includes a flexible underlying substrate 10, a back film 11 located on the flexible underlying substrate 10, wherein the back film 11 has openings corresponding to the sub bending areas Q21 in the display substrate areas Q1 of the display motherboard and has a second adhesive force obtained by treating the back film material 1 having the first adhesive force, and second adhesive force is greater than the first adhesive force.

A single display substrate is obtained by cutting the above display motherboard, the display substrate includes a flexible underlying sub-substrate 10'; a back film 11 located on the flexible underlying sub-substrate 10', wherein the back film 11 has openings corresponding to the sub bending areas Q21 in the display substrate areas Q1 of the display motherboard and has a second adhesive force obtained by processing the back film material 1 having the first adhesive force, and second adhesive force is greater than the first adhesive force.

The display device includes the above display substrate, wherein the display device may be an OLED display device, such as electronic paper, an OLED panel, a mobile phone, a tablet computer, a television, a display, a notebook computer, a digital photo frame, a navigator and any other products or components having display functions.

Example 1

Figure 8:
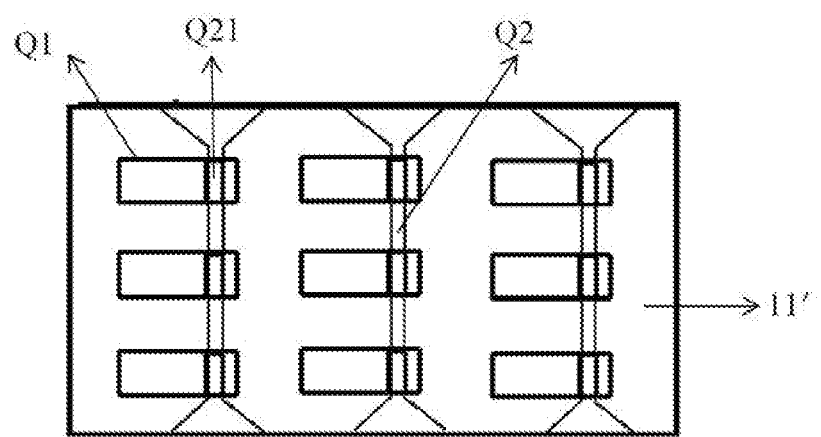
FIG. 8 is a schematic diagram of cutting the back film material corresponding to the bending area according to the present disclosure.

The present example provides a method for preparing a display motherboard, including:

1) forming a PI flexible underlying substrate having a thickness of 20 μm on a glass substrate;

2) forming a barrier layer, a buffer layer, a TFT array element, an OLED light emitting layer, a thin film package layer and an upper protective layer on the flexible underlying substrate successively, wherein the upper protective layer has a larger size than that of the flexible underlying substrate;

3) stripping off the flexible underlying substrate on which an optical device has been formed from the glass substrate, and then forming an back film material on the surface of the flexible underlying substrate away from the layers by a roller bonding manner. The adhesive force variable adhesive material in the back film material includes acrylic resin and an initiator 2-hydroxy-2-methyl-1-phenyl-1-propanone (abbreviated as HMPP). The adhesive force variable back film has a comparable size with the upper protective film;

4) cutting the back film material corresponding to the bending area Q2 on the back film material 1. The edge portion of the back film material is directly bonded to the upper protective film, so the adhesive force between the two portions is less than that between the back film and the PI flexible underlying substrate (adhesive force: back film to PI<100 gf/inch; back film to the upper protective layer<10 gf/inch), so the peeling force at the beginning edges is small, and then the back film materials in these positions are relatively easy to strip off. In addition, the cutting width of the back film material at the beginning edge and the tail edge in a non-display area may be greater than that of the bending area (as shown in FIG. 8), and thus the peeling yield may be greatly improved;

5) respectively adhering the beginning end of each film to be stripped off by using a bonding roller and attaching it to a strip-shaped mechanism, after the beginning ends of all films to be stripped off are stripped off, clamping the films on the strip-shaped mechanism, and then moving the strip-shaped mechanism, so that all films to be stripped off may be stripped off at one time;

6) coating a temporary protective film on the back film material after all sub bending areas Q21 of the back film material are removed; and 7) performing UV illumination on the back film material to obtain a back film having an adhesive force of 1.5 kg/inch, wherein the illumination energy is 3000 mJ/cm$^2$, and the illumination time is 60 s.

Therefore, in the method for manufacturing the display motherboard of the present disclosure, since the back film is formed by using the adhesive force variable adhesive material, the entire back film material may be directly formed on the flexible underlying substrate 10, and then the back film material in positions above the sub bending areas Q21 in the display substrate areas Q1 is removed in a single process, which simplifies the preparation process of the display motherboard, thereby effectively improving the preparation efficiency of the display motherboard, the display substrate and the display device.

It may be understood that the above embodiments are merely exemplary embodiments used for explaining the principles of the present disclosure, but the present disclosure is not limited thereto. Various modifications and improvements may be made by those of ordinary skill in the art without departing from the spirit and essence of the present disclosure, and these modifications and improvements are also encompassed within the protection scope of the present disclosure.

The invention claimed is:

1. A method for manufacturing a display motherboard comprising the following steps, wherein the display motherboard comprises a plurality of display substrate areas each comprising a sub display area and a sub bending area:

forming a back film material having a first adhesive force on a flexible underlying substrate;

removing the back film material in positions above the sub bending areas of the plurality of display substrates; and treating the remaining back film material to form a back film having a second adhesive force, wherein the second adhesive force is greater than the first adhesive force, wherein the back film material comprises an adhesive force variable adhesive material;

the adhesive force variable adhesive material comprises an adhesive and an initiator; and the adhesive comprises any one or more of epoxy resin and polyurethane resin and the initiator comprises any one or more of azobisisobutyronitrile, fluorescein, and eosin, wherein the method further comprises:

between the step of removing the back film material in positions above the sub bending areas of the plurality of display substrates and the step of treating the remaining back film material to form a back film having a second adhesive force, forming a protective film on one side of the back film material away from the flexible underlying substrate, the protective film covering openings of the back film material corresponding to the sub bending areas of the plurality of display substrates.

2. The method for manufacturing the display motherboard according to claim 1, wherein the plurality of the display substrate areas are arranged in an array; the display motherboard comprises a bending area running through the sub bending areas located on the same column; and the step of removing the back film material in positions above the sub bending areas of the plurality of display substrates specifically comprises:

removing the back film material in position above the bending area so as to remove the back film material in positions above the sub bending areas.

3. The method for manufacturing the display motherboard according to claim 1, wherein the step of treating the remaining back film material to form a back film having a second adhesive force comprises:

irradiating the remaining back film material with UV light to form the back film having the second adhesive force.

4. The method for manufacturing the display motherboard according to claim 3, wherein UV illumination is performed on one side of the flexible underlying substrate having the back film material.

5. The method for manufacturing the display motherboard according to claim 3, wherein the energy of the UV illumination is about 1000-5000 mJ/cm$^2$ and the illumination time is about 30-120 s.

6. The method for manufacturing the display motherboard according to claim 1, wherein the step of treating the remaining back film material to form a back film having a second adhesive force comprises:

heating the remaining back film material to form the back film having the second adhesive force.

7. The method for manufacturing the display motherboard according to claim 6, wherein heating is performed on one side of the flexible underlying substrate having the back film material.

8. The method for manufacturing the display motherboard according to claim 6, wherein the heating temperature is about 60-80° C. and the heating time is about 2-20 min.

9. The method for manufacturing the display motherboard according to claim 1, wherein the first adhesive force is about 20-400 g/inch.

10. The method for manufacturing the display motherboard according to claim 1, wherein the second adhesive force is greater than 1 kg/inch.

11. The method for manufacturing the display motherboard according to claim 1, wherein the sub bending area is located between the sub display area and a bonding area.

12. A method for manufacturing a display substrate, comprising the method for manufacturing the display motherboard according to claim 1.

* * * * *